United States Patent
Happer et al.

[11] 4,005,355
[45] Jan. 25, 1977

[54] METHOD AND APPARATUS FOR STIMULATING NARROW LINE RESONANCE CONDITIONS

[76] Inventors: William Happer, 560 Riverside Drive, New York, N.Y. 10027; Henry Y. S. Tang, 155 E. 93 St., New York, N.Y. 10028

[22] Filed: July 9, 1974

[21] Appl. No.: 486,863

[52] U.S. Cl. .......................... 324/.5 F; 331/94.5 H
[51] Int. Cl.² ....................................... G01R 33/08
[58] Field of Search .................. 324/.5 F, .5 R; 331/94.5 H

[56] References Cited
UNITED STATES PATENTS

| | | | |
|---|---|---|---|
| 3,246,254 | 4/1966 | Bell et al. .......................... | 324/.5 A |
| 3,267,360 | 8/1966 | Dehmelt .......................... | 324/.5 F |
| 3,281,709 | 10/1966 | Dehmelt .......................... | 324/.5 A |
| 3,652,926 | 3/1972 | Brun .......................... | 324/.5 F |
| 3,780,358 | 12/1973 | Thompson .......................... | 331/94.5 H |

OTHER PUBLICATIONS

E. H. Izen, "A Combined Magnetic Circular Dichroism and Electron Paramagnetic Resonance Spectrometer", Rev. of Sci. Inst., vol. 43, No. 11, Nov. 1972, pp. 1563–1567.

*Primary Examiner*—Robert Segal
*Assistant Examiner*—Michael J. Tokar
*Attorney, Agent, or Firm*—Brumbaugh, Graves, Donohue & Raymond

[57] ABSTRACT

A narrow line magnetic resonance device is disclosed which includes a radiation source to produce a beam of radiation for stimulating resonance lines in a quantum mechanical spin system. Frequent spin exchange collisions are utilized to produce narrow spectral resonance lines.

22 Claims, 1 Drawing Figure

METHOD AND APPARATUS FOR STIMULATING NARROW LINE RESONANCE CONDITIONS

The Government has rights in this invention pursuant to Contract Number DAAB 07-69-C-0383 awarded by the United States Department of the Army.

The invention relates to apparatus for stimulating and monitoring the orientation of electron spins of atoms by absorbed radiation, and in particular to apparatus for detecting the resonant properties of an optically oriented atomic spin system in a magnetic field to obtain a precise measurement of the field.

BACKGROUND OF THE INVENTION

The spectra resulting from transitions of optically oriented atoms in the presence of an electromagnetic field are known to be affected by a magnetic field so as to enable precise measurements of the magnetic field strength. A quantitative analysis of magnetic resonance in atomic spin systems may be found in many books and other publications. A brief qualitative explanation will suffice, however, for an understanding of the present invention.

Electrons are known to have a spin which gives rise to an intrinsic magnetic moment for the electron. If the electron is placed in an external magnetic field its magnetic moment interacts with the field to subject the electron to a torque. The electron, therefore, is caused to precess about the magnetic field at a rate proportional to the magnetic field strength.

Spectrographic observations have shown that an electron may assume only two discrete energy levels as a result of interaction between its spin magnetic moment and the external magnetic field. If a quantum of energy at a particular frequency, known as the resonance frequency, is supplied to electrons with one orientation some electron spin vectors can flip and assume the opposite orientation relative to the magnetic field. The resonance frequency is equal to the classical precession frequency.

Where the electrons are part of an atom, their movements are more complex due to the coupling of the electron spins to the internal magnetic fields of the atom, but the general qualitative behavior of an electron in an atom is very similar to that of a free electron. From a practical point of view, electrons in an atom are far more convenient for magnetic resonance applications than free electrons, since the atom as a whole is uncharged and has an indefinite lifetime under normal conditions. In contrast, a free electron has one unit of negative charge and it therefore interacts strongly with external electric and magnetic fields. Also, since free electrons rapidly recombine with positive ions, atoms, molecules or solid surfaces, the lifetime of a free electron is very short under normal conditions. It has been found that the atoms of alkali metal vapors are particularly convenient for use in systems designed for detection for magnetic resonance in optically pumped atoms.

One such system has been described by H. G. DEHMELT in U.S. Pat. No. 3,267,360, for use in a magnetometer. This patent relates to an optical technique, known as optical pumping, for aligning alkali atoms in an external magnetic field to be measured by the instrument. For alkali metals, photon energies corresponding to transitions between the ground state and the first excited state correspond substantially to optical wavelengths. Thus, alkali metal vapors are desirable for use in devices which utilize optical pumping techniques. The alignment of the alkali vapors is monitored by one of a number of techniques, for instance by detection of the light used to orient the alkali vapors into a "pumped" condition. As is well known in the art, monitoring of optically oriented alkali-metal vapors provides information from which the field strength of the external magnetic field may be calculated.

In the presence of a magnetic field, the total atomic angular momentum which results from both nuclear and electronic angular momenta, may precess about the field at discrete precession frequencies identifiable through appropriate monitoring of the atoms. The energy levels associated with these precession frequencies are known as Zeeman sublevels, and the totality of all Zeeman sublevels is called the hyperfine structure. Such hyperfine splitting of atomic energy levels occurs both in the ground-state and in the optically excited states.

When an atom has been excited, for example by absorbing a quantum of optical energy, from its ground state to an excited state, it decays through the various Zeeman sublevels back to the ground-state.

As disclosed in U.S. Pat. No. 3,267,360, the optical system which supplies light energy to the alkali atoms is designed to change the spin alignment of optically excited electrons. This may, for instance, be done through the use of a circular light polarizer disposed between the light source and the alkali atoms. When alkali atoms are illuminated by circularly polarized resonance light, the absorption rate of atoms in the ground-state sublevels corresponding to spin-down electrons is different from that of atoms in the ground-state sublevels corresponding to spin-up electrons. If no spin polarization is produced by the repopulation of the atomic ground state following spontaneous decay of the optically excited atoms, it is clear that more electrons will tend to accumulate in the weakly absorbing ground-state sublevels, compared to the strongly ground-state sublevels. Thus, over a period of time, usually on the order of $10^{-3}$ seconds, the alkali atoms can become appreciably less absorbing of light from the light source, and they thus become more transparent to the light.

In accordance with the known techniques, the non-absorbing electrons may be stimulated into a light absorbing sublevel by the application of an electromagnetic field at the magnetic resonance frequency for the electrons. At the resonance frequency, the electrons in the nonabsorbing sublevel of the ground state can make a transition to a light absorbing sublevel. When this occurs, the electrons absorb light, and therefore, the intensity of the pumping light which passes through the alkali material suddenly decreases. Once the resonance frequency for the electrons is determined by observing the intensity minimum, it is relatively simple to calculate the field strength of the external magnetic field acting on the system. It should be understood that it is also possible to detect magnetic resonance by observing the flourescence light from the vapor. In the case of flourescence light detection, magnetic resonance is indicated by an intensity maximum.

A comprehensive discussion of the quantum principles which underlie the operation of magnetometer may be found in an article by Robert E. Slocum and Francis N. Reilly entitled "Low Field Helium Magnetometer", IEEE Transactions on Nuclear Science, January 1963, pages 165 through 171. Also pertinent is an article by Arnold Green and J. M. Stanley, entitled "The Application of the Technique of Optical Pumping for the Precise Measurement of Weak Magnetic Fields", the Australian Physicist, March 1973, pages 52 through 54.

Devices which utilize these principles, however, have heretofore been thought to be subject to certain physical constraints, which severely limit their utility. (See, for example, Arnold L. Bloom, "Principles of Operation of the Rubidium Vapor Magnetometer" Applied Optics Vol. 1, No. 1, January 1962 pp. 64 and 65; and J. H. Allen, P. L. Bender "Narrow Line Rubidium Magnetometer for High Accuracy Field Measurements" J. Geomag. Geolectr., 24, 105–125, 1972) It has been thought heretofore that low density alkali vapor regimes were required to ensure accurate detection of the resonance frequency. Spectroscopic experiments on the effect of spin exchange collisions on linewidths and intensities of electromagnetic transitions of optically oriented atoms have shown a broadening of the width of the magnetic resonance curve with increasing density. Such broadening creates uncertainty in measurement of the resonance peak. As a result magnetometer devices heretofore have utilized relatively low density alkali-vapor regimes. This has required magnetometers to be relatively large and bulky, generally having an absorption cell volume of approximately 100 cubic centimeters. Such equipment, therefore, has been expensive and is, of necessity, limited to minimum risk uses. In addition, since the number of atoms to be pumped is relatively low the light intensity must be correspondingly low, usually about $10^{-3}$ watts. The result has been excessive shot noise in comparison to the signal which severely limits the sensitivity of the equipment.

SUMMARY OF THE INVENTION

It is an object of the present invention to provide a high density alkali-vapor regime to be optically pumped to produce a narrow magnetic resonance line with a frequency proportional to a magnetic field. In this way, an unknown magnetic field may be measured, or if the field is known, the characteristic magnetic resonance frequency for a material may be determined.

It has been discovered by the inventors herein that the practical upper limit to the atomic number density of the alkali vapor is very much higher than has been thought heretofore. At sufficiently high atomic number densities, spin exchange broadening of the resonance lines vanishes and the width of the magnetic resonance line is comparable to or even less than the width of the low-density magnetic resonance line. The high-density magnetic resonance frequency is still proportional to the intensity of the magnetic field, but the ratio of the magnetic resonance frequency to the field strength is smaller, by a predicted amount, than the low-density ratio. Under these conditions a sharp resonance peak may be detected from which the strength of an external magnetic field may be calculated. By way of example, at magnetic fields less than $10^{-2}$ gauss a suitable high density regime results where the alkali atomic number density is not less than $10^{14}$ atoms per cubic centimeter. In such a regime the time between spin exchange collisions is very short, and is very much less than the Larmar precession frequency with respect to the magnetic field for the atomic spin angular moment. In general, the residual magnetic resonance linewidth due to spin exchange collisions in the regime is proportional to the product of the mean time between spin exchange collisions and the square of the magnetic resonance frequency.

However, for any particular spin system, the atomic number density should preferably not be so high as to approach that of the liquid or solid state for the system. It is also necessary that the mean time between spin exchange collisions in the system will be long compared to the time required for the electron and the nuclear spin to precess about each other in the ground state, for example about $10^{-10}$ sec. for cesium. Thus, there is a practical upper limit to the atomic number density of the spin exchange system in the preferred embodiment of the invention since it is preferable to keep the spin exchange rate less than the hyperfine precession rate. It will be appreciated that this limit as to atomic number density will vary with different spin systems.

This implies, also, a practical upper limit on magnetic fields which can be precisely measured by any particular high-density magnetic resonance device. For example, with respect to a cesium magnetic resonance device, suppose that $f$ is the Larmar precession frequency of the cesium atoms in the maximum magnetic field H for which precise measurements are possible; if $\Delta f$ is the maximum tolerable magnetic resonance linewidth, and $f_{hfs}$ is the precession rate of the electron and nucleas about each other (the hyperfine structure frequency) then $$f^2 \leq \Delta f \, f_{hfs}$$

In cesium $f/H = 3.5 \times 10^5$ sec$^{-1}$ gauss$^{-1}$ and $f_{hfs} = 9 \times 10^9$ sec$^{-1}$. If it is assumed that $\Delta f = 350$ sec$^{-1}$ ($10^{-3}$ gauss) then $$f/H \leq 1.8 \times 10^6 \text{ sec}^{-1}$$

and $$H \leq 5.1 \text{ gauss}$$

The significant aspect of these inequality relationships is that $H$ is less than 5.1 gauss. In actual practice, it results that the practical upper limit on magnetic fields which can be precisely measured by the cesium device is about 1 gauss.

BRIEF DESCRIPTION OF THE DRAWINGS

For a further understanding of the present invention, reference may be had to the accompanying drawing in which.

BRIEF DESCRIPTION OF THE PREFERRED EMBODIMENTS

Figure 1:
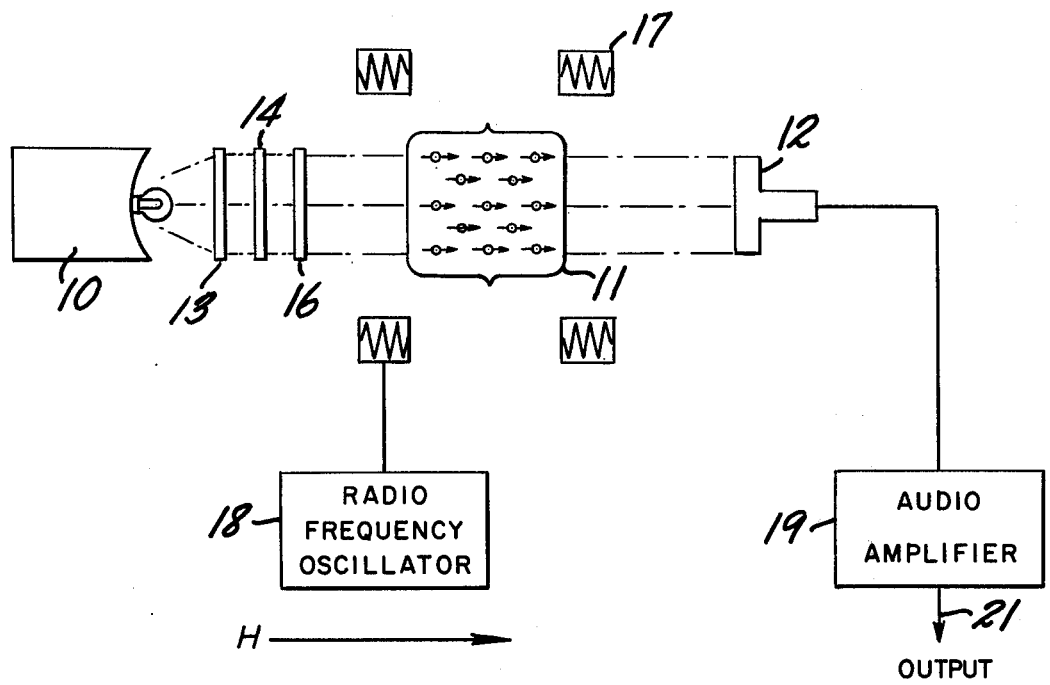
FIG. 1 is a schematic representation of a device constructed in accordance with the invention.

Referring now to the drawing, a system for monitoring the resonance properties of optically oriented atoms includes a radiation source 10, an absorption cell 11, arranged to intercept radiation emanating from the source 10, and a suitable detector or cell 12 for monitoring changes in the intensity of radiation passing through the absorption cell 11.

In the embodiment illustrated, the radiation source 10 is a lamp capable of producing an intense collimated beam of light radiation. It should be understood however, that means for polarizing or introducing a determinable order into the atoms of the spin system in the absorption cell other than electromagnetic radiation may also be utilized without departing from the scope of the present invention. Optical radiation is merely one preferred source for ordering or polarizing the atoms of the spin system.

Where electromagnetic radiation is used for pumping, an atomic vapor lamp may be utilized. The radiation source may also consist of a light-emitting diode, or a relatively small semi-conductor diode injection laser, both of which are particularly suitable for miniaturized, high precision, optically pumped devices constructed in accordance with the present invention.

In accordance with the invention, the thickness of the cell 11 is comparable to the mean free path of the pumping photons. In addition, the cell may be miniaturized, having as one example a volume of $10^{116\ 3}$ cm$^3$, or less. In one embodiment, the vapor contained within the cell is cesium, although other alkali metal vapors are equally suitable.

The cell also contains a buffer gas such as neon, nitrogen or helium. The buffer gas is selected to be chemically inert with respect to the components of the spin system.

The pressure of the buffer gas is maintained within a relatively high range of one to several hundred atmospheres. Buffer gas pressures within this range serve to reduce the absorption cross-section, for the radiation from the source 10, of atoms contained within the cell 11. Such pressures also minimize disorienting collisions of the spin-polarized atoms with the walls of the absorption vessel.

The particular value for the buffer gas pressure within this range depends upon the frequency stability of the radiation source as well as the components of the spin system. It has been found by the present inventors that a buffer gas pressure within the range identified above may be selected to offset the effects on a particular spin system of spectral linewidth or frequency "jitter" in the optical source. The otherwise narrow optical absorption line of the spin system is broadened by the pressure from the buffer gas. If the pressure of the buffer gas is selected to be high enough to broaden the absorption line of the system to encompass the entire "jitter" linewidth of the optical source, then substantially all of the emitted optical energy of the source is made available to pump or excite the atoms in the spin system.

For example, in the absorption system indicated in U.S. Pat. No. 3,267,360 to Dehmelt, the buffer gas pressure is approximately 0.04 atmospheres and the optical absorption linewidth of such a system is typically 0.01 angstroms. Such a narrow line optical absorption system could not be effectively pumped by a gallium arsenide laser, for example, having a spectral linewidth of as much as 30 angstroms.

By contrast, at 100 atmospheres of buffer gas pressure, the linewidth of the optical absorption line of the absorption system is in the order of 100 angstroms. Therefore, miniature gallium arsenide lasers with their low frequency stability would be effective sources of pumping light for a system having such a high buffer gas pressure.

The buffer gas pressure is preferably selected so as to broaden the absorption line of the system substantially to match the linewidth or frequency "jitter" in the optical source. In one embodiment of the invention for example, it was determined that a buffer gas pressure of approximately three atmospheres was sufficient. In this embodiment, the optical source consisted of a conventional electrode-less discharge lamp, and the absorption system consisted of cesium vapor.

In accordance with the invention, the atomic number density of the alkali (for instance, cesium) atoms must be made sufficiently high to eliminate the deleterious effects of spin exchange collisions. For a device that is designed to measure a maximum field H in gauss, the cesium atomic number density according to the invention is not less than, approximately $f^2/\Delta fr$ atoms per unit volume, where $f$ is the magnetic resonance frequency in the maximum magnetic field H, $\Delta f$ is the maximum tolerable magnetic resonance linewidth and R is the spin exchange rate constant (for cesium-cesium collisions R is on the order of $10^{-9}$ sec$^{-1}$ cm$^3$). In contrast to the conventional low density regime for optically pumped alkali vapors where the magnetic resonance linewidth increases with increasing alkali number density, the magnetic resonance linewidth decreases with increasing akali number density for the high density regime of this invention.

Since the number of pumped atoms contained within the cell is relatively high, the intensity of the light source 10 may also be relatively high. By way of example, the light source may be a one watt laser, in contrast to the one milliwatt lamps that are typically used in conventional optically pumped systems. Since the source of noise is generally the statistical uncertainty in the number of photons reaching the detector, the measurement can be made with the same degree of accuracy one thousand times faster with a one watt laser than with a one milliwatt conventional lamp, assuming that the magnetic resonance linewidth and the optical depth of the vapor are the same. Conversely, with the same integration time, it is possible to make a measurement about 30 times as accurately with a one watt laser as with a one milliwatt conventional lamp.

The high density regime is essential for proper utilization of the pumping radiations which are available from lasers, light emitting diodes and other high intensity sources. This is because in previous devices, such as disclosed by Dehmelt in U.S. Pat. No. 3,267,360 mentioned above, the magnetic resonance linewidth is generally broadened by such pumping radiations so that an increase of the optical pumping rate per atom leads to an increase in the magnetic resonance linewidth. This obviates any advantage which could be gained from the increased intensity of the pumping radiation. By contrast, the present invention enables efficient utilization of higher light intensity sources by providing a simultaneous increase in the number of absorbing atoms and a decrease in the absorption cross section of the atoms for the light, so that the mean pumping rate per atom is unchanged and the vapor retains the proper optical depth (approximately one mean-free-path for the pumping photons). The decrease in the absorption cross section is caused by the high buffer gas pressure. Alternatively, the absorption cross section may be decreased by selectively offsetting the frequency of the light source from the center of the atomic absorption line.

Arranged between the light source 10 and the absorption cell 11 is a linear polarizer 13 and a quarter wave plate 14 to produce a beam of circularly polarized light, and if necessary, a D$_1$ line filter 16 for eliminating undesirable fine structure components of the radiation prior to its entering the absorption cell. The polarizer 13 may be omitted where the light emitted from the source 10 is already polarized, such as may occur for example, when a laser is used.

The photocell 12 may be a silicon cell, and is connected to an audio amplifier 19 having an output 21 leading to suitable information processing equipment (not shown). Radio frequency depumping coils 17 surround the absorption cell 11 and are connected to a radio frequency oscillator 18.

When the system is placed in a magnetic field H, the optically pumped alkali vapor atoms in the absorption cell 11 orient themselves with respect to the direction of the field H, as indicated schematically in FIG. 1. In a typcal embodiment, as described below, the radio frequency oscillator 18 is utilized to sweep an electromagnetic field through the coils 17 at varying frequencies, until the resonance frequency for the optically oriented atoms in the vapor is reached. There is a known relationship between this resonance frequency and the strength of the magnetic field H, so that the latter may be calculated.

In operation, the light source 10 generates light radiation at a frequency proportional to the difference in the energies of the excited state and ground state of the alkali atom. The collimated light is plane polarized by passing it through the linear polarizer 13, and it is circularly polarized by the quarter-wave plate 14. The line filter 16 may be desirable under certain circumstances, generally depending upon the nature of the light source.

When the circularly polarized light interacts with an electron of the alkali atoms in the absorption vessel 11, the electron absorbs a photon and makes a transition to the first excited level. In addition, because the light is circularly polarized, the probability that the electron absorbs a photon depends on the initial spin orientation. In the presence of the magnetic field H, electrons in either the ground state or first excited level may assume certain of the Zeeman hyperfine energy sublevels. The splitting of energy levels arises because the coupled electron nucleus spin system interacts with an external magnetic field.

In the absence of any pumping light, approximately equal numbers of atoms will be found in each ground-state sublevel. However, the probability that an atom will absorb a photon of polarized light is different for each of the ground-state sublevels. Consequently, atoms will be excited out of strongly absorbing ground-state sublevels more rapidly than they are excited out of weakly absorbing sublevels. At high buffer gas pressures, which are necessary for operation of a miniaturized optically pumped device, it is known experimentally that an excited atom is equally likely to decay back to any ground-state sublevel, (see for example A. Mitchell and M. Zemansky, Resonance Radiation and Excited Atoms, Cambridge University Press, Cambridge 1961). Thus, atoms will tend to accumulate in the weakly absorbing sublevels and the vapor will become more transparent to the pumping light. This condition of maximum electron spin alignment is monitored by the photocell 12, the response of which depends upon the intensity of the light beam passing through the absorption vessel 11.

An electromagnetic field is generated by the rf oscillator 18 and is supplied to the depumping coils 17 surrounding the absorption vessel. When the frequency of the electromagnetic field reaches a value proportional to the separation energy of the Zeeman levels, the spin aligned electrons are depumped into the light absorbing levels. The light intensity being monitored by the photocell 12 therefore becomes a minimum at the point when depumped electrons begin to reabsorb photons from the light source. The strength of the magnetic field may be determined from the frequency of the rf electromagnetic field at the point of minimum light intensity. The width of the magnetic resonance line due to spin exchange in the high density regime has been found to be of the order of $f^2/NR$ where $f$ is the magnetic resonance frequency, N is the atomic number density of the alkali atoms and $1/NR$ is the mean time between spin exchange collisions. Because the resonance linewidth is proportional to $1/NR$, and R is approximately independent of N, the linewidth narrows as the density increases. This is in contrast to prior experimental results at low densities where it was found that the magnetic resonance linewidth was proportional to NR. For example, at an alkali (cesium) number density of $10^{15}$ atoms/cm$^3$ the mean time between spin exchange collisions is T $10^{-6}$ sec. It would have been expected, heretofore assuming that the linewidth is proportional to NR that the corresponding magnetic resonance linewidth would be $10^6$ Hz or about 3 gauss which is much too large for precision measurements of small magnetic fields. In contrast, it has been found experimentally that the low-field linewidth at high densities is actually $10^2$ Hz or about $3 \times 10^{-4}$ gauss, a difference of four orders of magnitude. This high density linewidth is comparable to the linewidth of previously described low density devices such as disclosed by Dehmelt.

Where desirable, the rate of spin exchange colisions in the alkali vapor can be controlled, for example, by heating or cooling the absorption cell 11. By way of example, this may be accomplished by circulating a hot oil bath around the absorption cell, or by inserting a small absorption cell into a minature oven.

It is desirable to miniaturize the optical pumping equipment in order to increase its potential uses. The best signal to noise ratio for such apparatus is achieved under conditions represented by the following relationship:

$$N\sigma L \simeq 1,$$

where N equals the alkali number density, $\sigma$ equals the photon absorption cross section, and L is the optical path length in the absorption cell 11. It can be seen from this relationship that if the optical path length L is reduced in an effort to miniaturize the equipment, N must correspondingly increase. As explained above, it has been thought heretofore that to increase N would result in disorienting the optically polarized atoms in numerous exchange collisions, thereby broadening the magnetic resonance line and preventing a precise measurement of the resonance frequency.

The present invention is based upon recognition of the principle that a sharp resonance peak of lower frequency occurs under conditions of very rapid spin exchange collisions in the absorption cell. Thus, the cell volume can be decreased and the alkali atomic number density increased beyond certain limits without disrupting the favorable signal to noise ration and without creating inaccuracies in determination of the resonance frequency.

If desired the oscillator 18 may be eliminated and the modulated component of the light detected by the photocell 12 amplified, phase shifted and fed back to the coils 17 to make a self-oscillating system. Such an arrangement would be particularly suitable in connection with miniaturized apparatus.

It should be noted that in some cases it may be expedient to use a spin system which includes atoms other than those of a pure alkali vapor, or molecules or ions which are capable of exchanging their internal angular momenta rapidly with each other or with different atomic species. Mixtures of alkali atoms may also be used. The particular mixture ratio will depend upon the nature of the polarizing means. For instance, sodium vapor at an appropriately high atomic number density (approximately $10^{18}$ atoms per cubic centimeter) may be used with cesium. If the polarizing means is a laser having a frequency instability or jitter of from 10–20 angstroms, the optimum number of cesium atoms to be mixed with the sodium is approximately $10^{14}$ atoms per cubic centimeter. In such a mixture, the angular momentum is stored mainly in the sodium atoms and the pumping laser light interacts only with the cesium atoms. Since the cesium atoms are only a small fraction of the total number of alkali atoms, very high total atomic number densities could be attained without making the vapor optically thick for the cesium pumping light. Also, since sodium atoms relax much more slowly than cesium atoms in the inert buffer gases, narrower magnetic resonance lines could be achieved.

In addition, mixtures of cesium with helium 3 gas or hydrogen might be used. In this case, most of the angular momentum is stored in nuclear spins. Such a system is characterized by an extremely small magnetic resonance frequency.

A theoretical and quantitative explanation of certain principles underlying this invention is set forth in an article entitled "Spin Exchange Shift and Narrowing of Magnetic Resonance Lines in optically Pumped Alkali Vapors" Physical Review Letters Volume 31, No. 5, July 30, 1973, by W. Happer, and H. Tang.

It will be understood that spectrographic apparatus according to the present invention is susceptible of various modifications, changes and adaptations as will occur to those skilled in the art. It is therefore intended that the scope of the present invenion is not to be limited except as defind by the following claims.

What is claimed is:

1. Apparatus for monitoring polarization induced by optical pumping of a system of quantum mechanical spins in a magnetic field, comprising means for containing a gaseous sample of the spin system in which angular momentum is exchanged between the spins at a rate which is substantially greater than the rate of precession of the spins with respect to the magnetic field together with an inert buffer gas at a pressure sufficient to diminish the optical depth of the spin system, means for polarizing said spin system and means for detecting polarization in said spin system.

2. The apparatus of claim 1 in which said polarizing means comprises a source of radiation to irradiate said spin system to stimulate magnetic resonance conditions therein.

3. The apparatus of claim 2 in which said spin system comprises an atomic vapor having a predetermined atomic number density such that atomic angular momentum is exchanged within the vapor at a rate substantially greater than said rate of precession.

4. The apparatus of claim 3 in which said atomic vapor comprises an alkali metal vapor including groups of atoms, ions and molecules, at least one of said groups being responsive to radiation from said source to produce the resonance conditions and being present in a quantity substantially smaller than the other groups.

5. The apparatus of claim 1 in which the spin system is contained within an inert buffer fluid having a predetermined pressure sufficient to diminish the optical depth and to broaden the radiation absorption line of the system to maximize the response of said system to said polarizing means.

6. The apparatus of claim 5 in which the system is contained within a cell having a volume of not more than approximately $10^{-3}$ cm$^3$.

7. The apparatus of claim 6 in which the length of said cell is not more than 11 millimeter.

8. Apparatus for monitoring magnetic resonance conditions induced by optical pumping of a system of quantum mechanical spins in a magnetic field, comprising:

means for containing a gaseous sample of the spin system in which angular momentum is exchanged between the spins at a rate which is substantially greater than the rate of precession of the spins with respect to the magnetic field together with an inert buffer gas at a pressure sufficient to diminish the optical depth of the spin system;

a source of optical radiation to irradiate said sample to stimulate resonance conditions therein; and means for detecting the resonance conditions.

9. The apparatus of claim 8 in which said source of optical radiation comprises a laser.

10. Apparatus for monitoring magnetic resonance conditions induced by optical pumping of a system of quantum mechanical spins in a magnetic field comprising:

means for containing a gaseous sample of thhe spin system which includes cesium vapor having an atomic number density such that atomic angular momentum is exchanged within the vapor at a rate substantially greater than the rate of precession of the atomic angular momemta with respect to the magnetic field, together with an inert buffer gas at a pressure sufficient to diminish the optical depth of the spin system;

a source of optical radiation to irradiate said cell, said vapor being responsive to said radiation to produce a resonance condition; and means for detecting the resonance condition.

11. The apparatus of claim 10 in which said system is contained within a buffer gas comprising helium and having a predetermined pressure sufficient to diminish the optical absorption line of the system to maximize the response of said system to said source of optical radiation.

12. The apparatus of claim 10 in which said system is contained within a buffer gas comprising nitrogen and having a predetermined pressure sufficient to diminish the optical depth and to broaden the optical absorption line of the system to maximize the response of said system to said source of optical radiation.

13. The apparatus of claim 10 in which said system is contained within a buffer gas comprising neon and having a predetermined pressure sufficient to diminish the optical depth and to broaden the optical absorption line of the system to maximize the response of said system to said source of optical radiation.

14. The apparatus of claim 10 in which said source of optical radiation comprises a laser.

15. The apparatus of claim 10 in which said source of optical radiation comprises a light emitting diode.

16. A method of monitoring magnetic resonance conditions induced by optical pumping of a system of quantum mechanical spins in a magnetic field, comprising the steps of:

establishing a gaseous sample of the system having at atomic number density such that angular momentum is exchanged between the spins at a rate substantially greater than the rate of precession of the spins with respect to the magnetic field, the system being under pressure within an inert buffer gas having a pressure sufficient to diminish the optical depth of the spin system and to broaden the radiation absorption line of the system;

irradiating said sample; and detecting the resonance condition produced in the system by the irradiation of said sample.

17. The method of claim 16 in which the system consists of an atomic vapor having an atomic number density of not less than approximately $f^2/\Delta fR$ atoms per unit volume, where f is the magnetic resonance frequency for the vapor and R is approximately $10^{-9} \sec^{-1} cm^3$, thereby to insure rapid spin exchange between components of the system.

18. The method of claim 17 in which the mean time between exchanges of angular momentum in the system is approximately 1/NR, where N is the atomic number density of said sample.

19. The method of claim 18 in which the width of the magnetic resonance line of the system is approximately $f^2/NR$.

20. The method of claim 19 including irradiating the system with optical radiation from a gallium arsenide injection laser.

21. Spectrographic apparatus for detecting spin system resonance conditions induced by optical pumping of the system in a magnetic field comprising:

a source of electromagnetic radiation;

a gaseous quantum spin system in which the time between atomic collisions is substantially less than the Larmor precession period with respect to the magnetic field for angular momenta of the system, said system being within an inert buffer gas under pressure sufficient to diminish its optical depth and being responsive to the radiation from said source to produce a resonance spectra, and means for detecting said resonance spectra.

22. The apparatus of claim 6 in which said polarization means comprises a sources of radiation directed along the length of said cell to irradiate said spin system to stimulate magnetic resonance conditions therein.

* * * * *

UNITED STATES PATENT AND TRADEMARK OFFICE
CERTIFICATE OF CORRECTION

PATENT NO. : 4,005,355
DATED : January 25, 1977
INVENTOR(S) : William Happer et al.

It is certified that error appears in the above-identified patent and that said Letters Patent are hereby corrected as shown below:

Col. 1, Line 34, change "guantum" to -- quantum --;
Col. 1, Line 58, change "for" to -- of --;
Col. 2, Line 40, insert "absorbing" before -- ground-state --;

Col. 3, Line 14, change "Geolectr" to -- Geoelectr --;
Col. 3, Lines 64 & 65, change "Larmar" to -- Larmor --;
Col. 4, Line 22, change "Larmar" to -- Larmor --;
Col. 5, Line 16, change "$10^{116}$ $3cm^3$" to -- $10^{-3}$ $cm^3$ --;
Col. 5, Line 48, change "indicated" to -- disclosed --;
Col. 6, Line 10, change "$f^2/\Delta fr$" to -- $f^2/\Delta fR$ --;
Col. 6, Line 20, change "akali" to -- alkali --;
Col. 7, Line 13, change "typcal" to -- typical --;
Col. 8, Line 20, insert "≈" between " T $10^{-6}$ ";
Col. 8, Line 32, change "colisions" to -- collisions --;
Col. 8, Line 37, change "minature" to -- miniature --;
Col. 8, Lines 64 & 65, change "reasonance" to -- resonance --;
Col. 9, Line 15, put quotation marks around the word -- jitter --
Col. 9, Line 36, change "optically" to -- Optically --;
Col. 9, Line 44, change "defind" to -- defined --;
Col. 10, Line 15, change "11 millimeter" to -- 1 millimeter --;
Col. 10, Line 36, change "thhe" to -- the --;
Col. 10, Line 41, change "momemta" to -- momenta --;

UNITED STATES PATENT OFFICE
CERTIFICATE OF CORRECTION

Patent No. 4,005,355    Dated January 25, 1977

Inventor(s) William Happer et al.

It is certified that error appears in the above-identified patent and that said Letters Patent are hereby corrected as shown below:

Col. 11, line 7, change "at" to -- an --;
Col. 12, line 13, insert "," after -- field --;
Col. line 25, change "sources" to -- source --.

Signed and Sealed this

Twenty-fourth Day of May 1977

[SEAL]

Attest:

RUTH C. MASON
Attesting Officer

C. MARSHALL DANN
Commissioner of Patents and Trademarks